United States Patent [19]
Komatsu et al.

[11] Patent Number: 5,811,803
[45] Date of Patent: Sep. 22, 1998

[54] ELECTRON MICROSCOPE

[75] Inventors: Fumio Komatsu, Fuchu; Hiroshi Motoki, Kawasaki, both of Japan

[73] Assignee: Kabushiki Kaisha Toshiba, Kawasaki, Japan

[21] Appl. No.: 915,399

[22] Filed: Aug. 20, 1997

[30] Foreign Application Priority Data

Aug. 23, 1996 [JP] Japan .................................. 8-222383

[51] Int. Cl.$^6$ ...................................................... H01J 37/18
[52] U.S. Cl. ...................................... 250/310; 250/441.11
[58] Field of Search ................................ 250/310, 441.11

[56] References Cited

U.S. PATENT DOCUMENTS 3,963,922  6/1976  Zulliger et al. ......................... 250/310

*Primary Examiner*—Kiet T. Nguyen
*Attorney, Agent, or Firm*—Finnegan, Henderson, Farabow, Garrett & Dunner, L.L.P.

[57] ABSTRACT

An electron microscope comprises: a electron optical column 5 for allowing an electron beam aligned and focused by a lens 2, 3, 4 to pass therethrough; a specimen chamber 8 for receiving therein a sample 7 which is irradiated with the electron beam passing through the electron optical column; and a separating thin film 6, mounted so as to close an opening of the electron optical column on the side of the specimen chamber, for separating the electron optical column from the specimen chamber in a vacuum level.

8 Claims, 3 Drawing Sheets

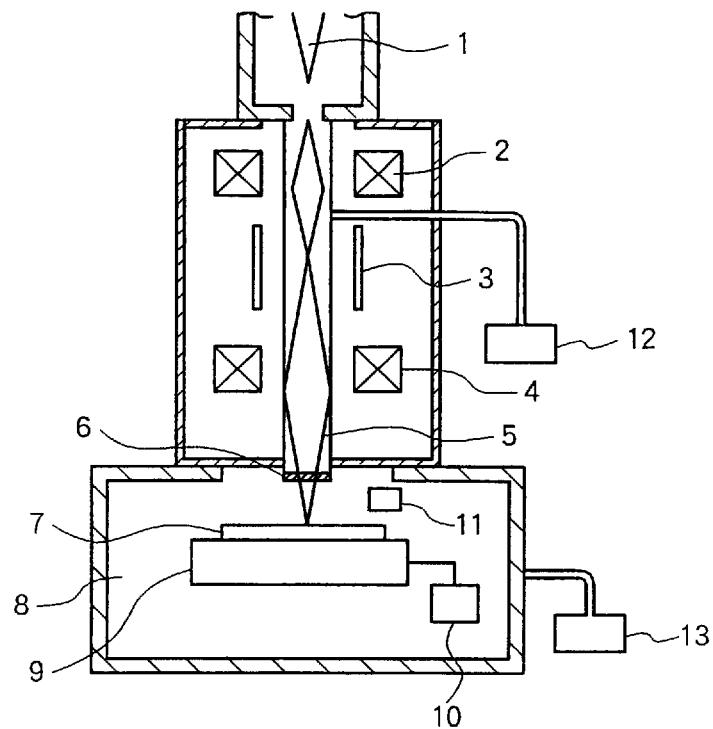
F I G. 1
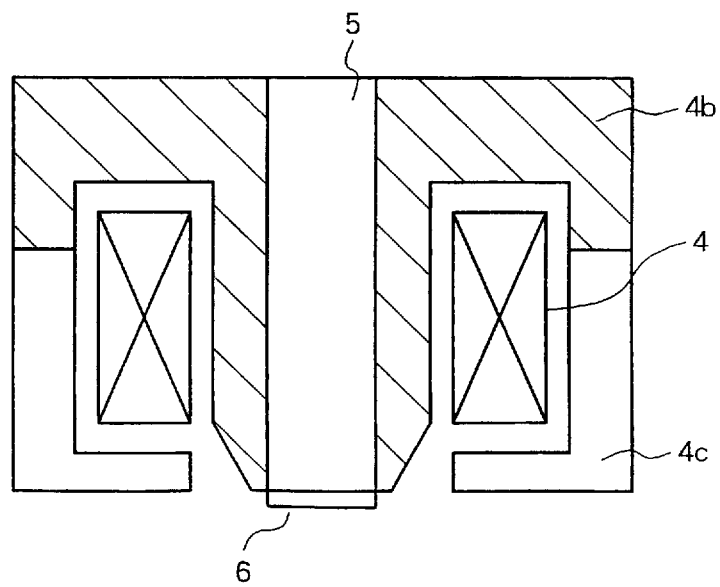
F I G. 2

|  | (1) | (2) | (3) |
|---|---|---|---|
| 0sec. | 280 | 277 | 280 |
| 100sec. | 284 | 281 | 284 |
| 200sec. | 284 | 287 | 281 |
| 300sec. | 292 | 288 | 288 |
| 400sec. | 300 | 293 | 295 |
| 500sec. | 293 | 287 | 292 |

(a)

(b)

ELECTRON MICROSCOPE

BACKGROUND OF THE INVENTION

1. Field of the Invention

The present invention relates generally to an electron microscope. More specifically, the invention relates to an electron microscope which has a separating thin film for separating a vacuum electron optical column from a vacuum specimen chamber.

2. Description of the Prior Art

In conventional electron microscopes, a low-vacuum (about $10^{-5}$ torr) specimen chamber is in connection with a high-vacuum (about $10^{-7}$ torr) electron optical column, and the working exhaust forms only the gradient of degree of vacuum between the specimen chamber and the electron optical column.

In this case, immediately after an atmospheric sample is carried to the specimen chamber after being exhausted in a load lock chamber, although the degree of vacuum in the specimen chamber is reduced by about hundredths, the degree of vacuum in the electron optical column is maintained to be higher than that in the specimen chamber since the gradient of degree of vacuum is formed in the electron optical column in accordance with the value of conductance thereof.

However, it is impossible to completely block carbon contaminants produced from the sample by continuing to irradiate the sample with electron beams, so that it mainly causes the performance degradation of the lens system and aperture in the electron optical column and so forth.

By the way, the observed magnification of an electron microscope is required to be a magnification of a hundred thousand or more with the scale down of a semiconductor device. As the observed magnification increases, the dose (dose density per unit area) of electron beams also increases.

As a result, hydrocarbon contaminants are produced from the sample by irradiating the sample with electron beams, so that (i) the degradation of degree of vacuum is caused in the electron optical column and (ii) the produced contaminants are adhered to the lens system (mainly an objective lens) and the aperture system in the electron optical column. These reduce the resolving power and the measuring accuracy.

FIG. 6 shows the results obtained when the same patterns were repeatedly measured by a measured magnification of 50kx at an electron beam current of 2 pA. The increased critical dimension of the measured patterns shows that the measured value fluctuates due to contaminants adhered to the sample.

These contaminants accumulate in the electron optical column, and the inventors have found that such a fluctuation of critical dimension can be restrained by more powerfully exhausting the electron optical column. FIG. 7 shows the results obtained when the same samples as those of FIG. 6 were measured under the same conditions as those of FIG. 6. It can be seen from FIG. 7 that the fluctuation of critical dimension shown in FIG. 6 did not occurred. The results shown in FIG. 7 can be obtained by improving the electron optical column so that the neighborhood of the objective lens in the electron optical column can be additionally exhausted.

However, even if such an additional exhaust mechanism is provided in the electron optical column, it is difficult to remove the contaminants adhered to the objective lens or the aperture.

SUMMARY OF THE INVENTION

It is therefore an object of the present invention to eliminate the aforementioned problems of the prior art and to provide an electron microscope which can separate a electron optical column from a low-vacuum specimen chamber to maintain the interior of the lens barrel in a high vacuum level under no influence of contaminants produced in the specimen chamber.

In order to accomplish the aforementioned and other objects, according to one aspect of the present invention, an electron microscope comprises: a electron optical column for allowing an electron beam aligned and focused by a lens to pass therethrough; a specimen chamber for receiving therein a sample which is irradiated with the electron beam passing through the electron optical column; and a separating thin film, mounted so as to close an opening of the electron optical column on the side of the specimen chamber, for separating the electron optical column from the specimen chamber in a vacuum level.

The separating thin film may be of a material which prevents an outlet gas from being produced when the sample is irradiated with the electron beam. The separating thin film is preferably made of SiC. Alternatively, the separating thin film may be a sintered compound containing silicon and carbon. Preferably, the separating thin film has a uniform thickness. In addition, the pressure resistance of the separating thin film is preferably 1 kg/cm$^2$ or more in a thickness of 1 $\mu$m, and the specific resistance of the separating thin film is preferably $10^4$ $\Omega$·m or more.

According to another aspect of the present invention, an apparatus for measuring the critical dimension of a pattern, comprises: a electron optical column for allowing an electron beam aligned and focused by a lens to pass therethrough; a specimen chamber for receiving therein a sample which is irradiated with the electron beam passing through the electron optical column; a separating thin film, mounted so as to close an opening of the electron optical column on the side of the specimen chamber, for separating the electron optical column from the specimen chamber in a vacuum level; and critical dimension measuring means for measuring the critical dimension of a pattern formed on the sample.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 1 is a sectional view of the preferred embodiment of an electron microscope according to the present invention;

FIG. 2 is an enlarged sectional view showing the neighborhood of a electron optical column of the electron microscope of FIG. 1;

DESCRIPTION OF THE PREFERRED EMBODIMENTS

Figure 3:
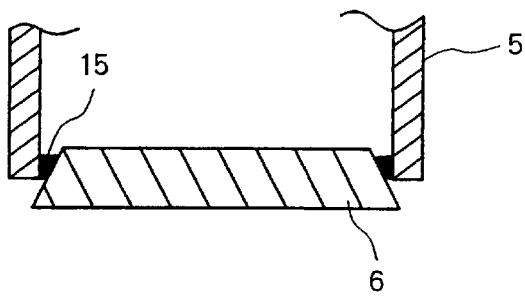
FIG. 3 is a sectional view of the preferred embodiment of a separating thin film mounted on a electron optical column of an electron microscope according to the present invention.

Referring now to the accompanying drawings, particularly to FIGS. 1 through 5, the preferred embodiments of an electron microscope according to the present invention will be described below.

FIG. 1 schematically shows the preferred embodiment of an electron microscope according to the present invention. In FIG. 1, the electron microscope comprises: an electron gun 1; a lens system including a condenser lens 2, a deflection lens 3 and an objective lens 3 for aligning and focusing electron beams emitted from the electron gun 1; a electron optical column 5 for allowing the electron beams controlled by the lens system to pass therethrough; a separating thin film 6 mounted on an opening portion of the electron optical column on the side of a specimen chamber 8; and the specimen chamber 8 for receiving therein a sample 7 which is irradiated with the electron beams passing through the electron optical column 5 and the separating thin film 6. The sample 7 is supported on a table 9. The movement of the table 9 is controlled by movement control means 10 which has critical dimension measuring means. The pattern on the sample 8 is irradiated with the electron beam to produce a secondary electron signal. The produced secondary electron signal is detected by means of a detector 11. The interior of the electron optical column 5 is evacuated to about $10^{-7}$ torr by means of an ion pump 12, and the interior of the specimen chamber 8 is evacuated to about $10^{-5}$ torr by means of a turbo molecular pump 13.

FIG. 2 is an enlarged view of the neighborhood of the separating thin film 6. As can be clearly seen from FIG. 2, the separating thin film 6 is mounted on the opening portion of the electron optical column 5. The objective lens 4 comprises a lens coil 4a, an upper pole 4b and a lower pole 4c, which are arranged within the electron optical column 5.

The critical dimension of the pattern formed on the sample 7 is measured on the basis of the scanning amount of the electron beam and sampling count of the table 9 by scanning the electron beam on the sample 7, detecting the secondary electron signal by means of the detector 11 and controlling the movement of the table 9 by the movement control means 10.

The structure of the separating thin film 6 will be described in detail below. The required characteristics of the separating thin film 6 are as follows.

(1) The separating thin film 6 must be accurately worked so as to be thin enough to allow an electron beam to pass therethrough. That is, the separating thin film 6 must be of a material having a low density and a low atomic number in order to suppress the scattering of the electron beam, and the thickness thereof must be accurately uniform. Because, if the separating thin film is not uniform, the electron beam scanned in a direction perpendicular to an optical axis passes through the separating thin film 6 serving as a kind of wedge-shaped prism so that the shape of the electron beam is asymmetrical about the optical axis.

The materials conventionally used for the interior of the electron optical column, e.g., an electrically conductive nylon and an electrically conductive ceramic, cause problems in working accuracy, and it is very difficult to work the materials so as to be thin enough to allow an electron beam to pass therethrough.

(2) If the separating thin film 6 is formed of metallic materials, it is difficult to disregard eddy-current loss. In order to allow the eddy-current loss to be disregarded, it is required to reduce the deflection speed of an electron beam, so that the through put is lowered.

In order to allow the influence of an eddy current to be disregarded even if the deflection is carried out at a high speed (8 kHz), it is desired that the separating thin film 6 has a specific resistance of $10^4$ to $10^5$ $\Omega \cdot$cm or more.

(3) When the separating thin film 6 is irradiated with electron beams, it is required to decrease the amount of the produced out gas as much as possible, so that it is required to allow the exhaust to be carried out to a pressure up to at least 10–5 torr.

(4) The pressure resistance of the separating thin film 6 must be higher than 1 kg/cm$^2$. The electron optical column 5 is evacuated to about $10^{-7}$ torr, and the specimen chamber 8 is evacuated to about $10^{-5}$ torr, so that the separating thin film 6 must have a pressure resistance enough to resist the difference between the degrees of vacuum of the electron optical column 5 and the specimen chamber 8.

In the preferred embodiment, a sintered compound of SiC was used as a material of the separating thin film 6 so as to satisfy the aforementioned requirements, so that the separating thin film 6 having a thickness of about 1 $\mu$m was formed.

Figure 4:
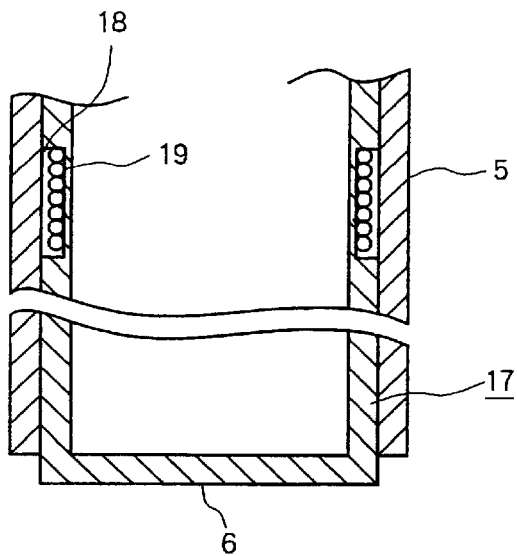
FIG. 4 is a sectional view of another preferred embodiment of a separating thin film mounted on a electron optical column of an electron microscope according to the present invention.
Figure 5:
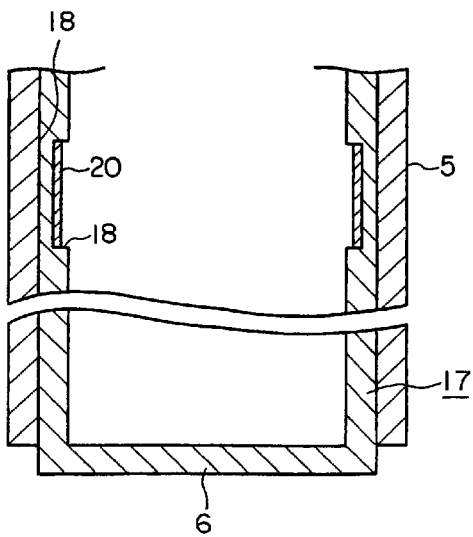
FIG. 5 is a sectional view of another preferred embodiment of a separating thin film mounted on a electron optical column of an electron microscope according to the present invention.
Figure 6:
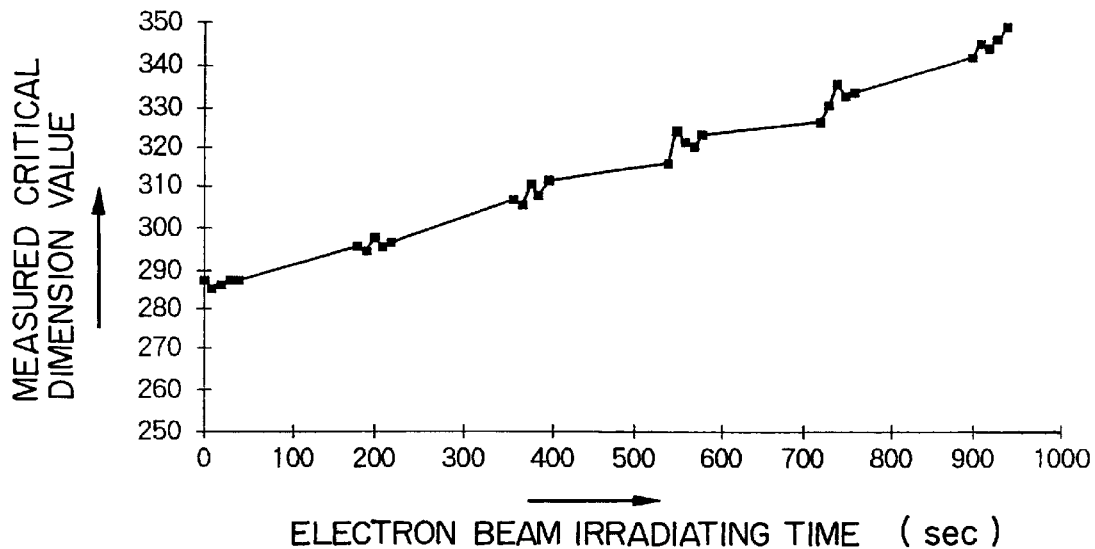
FIG. 6 is a graph showing the fluctuation of the measured critical dimension value with time when the same patterns are repeatedly measured by a conventional electron microscope, which shows that carbon contaminants produced by the irradiation of electron beams are adhered to the surface of a sample again to thicken the measured patterns with irradiating time.
Figure 7:
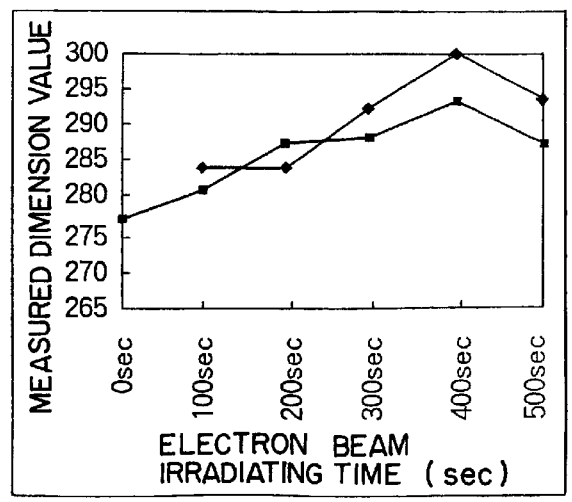
FIG. 7 is a graph showing the results observed when the same patterns are those of FIG. 6were measured under the same conditions as those of FIG. 6 in a case where the conventional electron microscope is improved so that the peripheral of an objective lens of a electron optical column can be forcibly exhausted.

Referring to FIGS. 3 through 5, a method for mounting the separating thin film 6 on the electron optical column 5 will be described below. Furthermore, in these drawings, the thickness and so forth of the separating thin film 6 are enlarged in comparison with other members for the sake of understanding.

In the preferred embodiment shown in FIG. 3, the separating thin film 6 has a shape of flat plate, and is tapered upwards so as to have a conically trapezoid shape. The diameter of the upper face of the conical trapezoid is smaller than that of the opening of the electron optical column 5, and the diameter of the lower face thereof is greater than the opening of the electron optical column 5. After a vacuum grease 15 is applied to the inner wall surface of the electron optical column 5, the separating thin film 6 is inserted into the opening of the electron optical column 5, and the electron optical column 5 is evacuated so that the separating thin film 6 is fixed to the electron optical column 5.

In the preferred embodiments shown in FIGS. 4 and 5, the separating thin film 6 is formed as the bottom surface of a cup-shaped cylindrical body 17 of a sintered compound of SiC. The cylindrical body 17 is inserted into the opening of the electron optical column 5 so that the outer wall surface of the cylindrical body 17 is in tightly contact with the inner wall surface of the electron optical column 5. Thus, the cylindrical body 17 is held in the electron optical column 5, so that the separating thin film 6 is fixed to the opening portion of the electron optical column 5.

In addition, in the preferred embodiment shown in FIG. 4, a shallow groove 18 having a depth of about 0.5 $\mu$m is formed in the outer side face of the cylindrical body 17, and a coil 19 forming the deflection lens 3 is wound onto the groove 18. In the preferred embodiment shown in FIG. 5, a shallow groove 18 having a depth of about 0.5 µm is formed in the inner side face of the cylindrical body 17, and a gold deposition thin film 20 forming the deflection lens 3 is formed in the groove 18.

In the preferred embodiments shown in FIGS. 4 and 5, the cylindrical body 17 can be accurately positioned so as to be coaxial to the electron optical column 5. Therefore, it is possible to accurately position the coil 19 or the deposition thin film 20 with respect to the axis of the electron optical column 5. As a result, it is possible to accurately deflect and scan electron beams, and it is possible to easily design the power supply of the deflection lens 3 and so forth.

The separating thin film 6 of a sintered compound of SiC thus formed has a thickness of about 1 µm or less. The energy dispersion of an electron beam passing through the separating thin film 6 may cause the oscillation phenomenon of energy loss due to plasmon excitation. However, this influence can be disregarded if an electron beam of a low energy is used, e.g., in the case of a scanning electron microscope (SEM) for measuring the critical dimension of patterns.

In addition, with respect to the stress applied to the separating thin film 6 (due to a differential pressure), it was verified that the separating thin film 6 can resist a differential pressure of 1 atm when the bore diameter of the opening of the electron optical column 5 is about 8 mm.

In the aforementioned preferred embodiments, while the separating thin film 6 has been mounted so as to close the opening of the electron optical column 5 on the side of the specimen chamber 8, the opening may be partially closed so as to prevent contaminants from entering the electron optical column 5 without being completely closed.

With the aforementioned constructions, the electron beam emitted from the electron gun 1 is aligned and focused by the lens system 2, 3 and 4, and passes through the electron optical column 5 and the separating thin film 6. Then, the sample 7 is irradiated with the electron beam, so that contaminants, such as hydrocarbon, are discharged from the sample 7. The contaminants thus discharged from the sample 7 are blocked by the separating thin film 6 so as not to enter the electron optical column 5. Therefore, it is possible to prevent the contaminants from being accumulated in the electron optical column 5. As a result, it is possible to eliminate the problems when the separating thin film 6 is not provided, i.e., it is possible to prevent the measuring accuracy from being lowered by preventing contaminants accumulated in the electron optical column 5 from being adhered to the sample 7 again to prevent the line width from being increased as an irradiation time of the electron beam is increased.

In addition, since the separating thin film 6 is formed of a sintered compound of SiC, the separating thin film 6 can be easily worked so as to have a uniform thickness. In addition, since the separating thin film 6 has a specific resistance of $10^4$ to $10^5$ Ω·cm, it is possible to deflect the electron beam at a high speed of 8 kHz without being under the influence of an eddy current. Moreover, since no out gas is produced by irradiating the separating thin film 6 with electron beams, it is possible to easily evacuate the electron optical column 5 and the specimen chamber 8 to a pressure of $10^{-5}$ torr or less.

As mentioned above, according to the present invention, since a separating thin film for separating a electron optical column from a specimen chamber in a vacuum level is provided so as to close the opening of the electron optical column on the side of the specimen chamber, it is possible to prevent contaminants produced by the irradiation of electron beams from entering the electron optical column. In addition, since the interior of the electron optical column can be always maintained in a high vacuum level, the resolution is never degraded, so that it is possible to suppress the fluctuation of the measured value of critical dimension.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. An electron microscope comprising:
    an electron optical column for allowing an electron beam aligned and focused by a lens to pass therethrough;
    a specimen chamber for receiving therein a sample which is irradiated with the electron beam passing through the electron optical column; and
    a separating thin film, mounted so as to close an opening of the electron optical column on the side of the specimen chamber, for separating the electron optical column from the specimen chamber in a vacuum level.

2. The electron microscope according to claim 1, wherein said separating thin film is of a material which prevents an outlet gas from being produced when said sample is irradiated with the electron beam.

3. The electron microscope according to claim 2, wherein said separating thin film is of SiC.

4. The electron microscope according to claim 1, wherein said separating thin film is a sintered compound containing silicon and carbon.

5. The electron microscope according to claim 1, wherein said separating thin film has a uniform thickness.

6. The electron microscope according to claim 1, wherein said separating thin film has a pressure resistance of not less than 1 kg/cm² in a thickness of 1 µm.

7. The electron microscope according to claim 1, wherein said separating thin film has a specific resistance of not less than $10^4$ Ω·m.

8. An apparatus for measuring the critical dimension of a pattern, which comprises:
    an electron optical column for allowing an electron beam aligned and focused by a lens to pass therethrough;
    a specimen chamber for receiving therein a sample which is irradiated with the electron beam passing through the electron optical column;
    a separating thin film, mounted so as to close an opening of the electron optical column on the side of the specimen chamber, for separating the electron optical column from the specimen chamber in a vacuum level; and
    critical dimension measuring means for measuring the critical dimension of a pattern formed on the sample.

* * * * *